(12) United States Patent
Wang et al.

(10) Patent No.: US 9,141,000 B2
(45) Date of Patent: Sep. 22, 2015

(54) DOUBLE-SURFACE MANUFACTURING METHOD AND EXPOSURE APPARATUS

(71) Applicant: BOE TECHNOLOGY GROUP CO., LTD., Beijing (CN)

(72) Inventors: Can Wang, Beijing (CN); Xuan He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/085,331

(22) Filed: Nov. 20, 2013

(65) Prior Publication Data

US 2014/0139813 A1 May 22, 2014

(30) Foreign Application Priority Data

Nov. 21, 2012 (CN) .......................... 2012 1 0477747

(51) Int. Cl.
*G03F 7/20* (2006.01)
*G03F 9/00* (2006.01)

(52) U.S. Cl.
CPC .............. *G03F 7/70725* (2013.01); *G03F 7/20* (2013.01); *G03F 7/70425* (2013.01); *G03F 9/7003* (2013.01); *G03F 9/7084* (2013.01)

(58) Field of Classification Search
CPC ............ G03F 7/70358; G03F 7/70775; G03F 7/70716; G03F 9/7015; G03F 7/2022; G03F 7/70516; G03F 7/70733; G03F 9/70; G03F 7/20; G03F 9/7088; G03F 1/00; G03F 7/70275; G03F 7/70633; G03F 7/70691
USPC ........................................ 430/5, 322, 311, 22
See application file for complete search history.

(56) References Cited

U.S. PATENT DOCUMENTS

| 5,923,403 A | * | 7/1999 | Jain .................................. 355/26 |
| 5,940,528 A | * | 8/1999 | Tanaka et al. .................. 382/151 |
| 2010/0086194 A1 | * | 4/2010 | Fan et al. ....................... 382/144 |

FOREIGN PATENT DOCUMENTS

| DE | 2352035 A1 | 4/1975 |
| EP | 0756207 A2 | 1/1997 |
| JP | S6172216 A | 4/1986 |
| JP | H03273608 A | 12/1991 |

(Continued)

OTHER PUBLICATIONS

Second Office Action issued by the Chinese Patent Office for Chinese Patent Application No. 201210477747.7 dated Sep. 4, 2014, 6pgs.

(Continued)

*Primary Examiner* — Caleen Sullivan
(74) *Attorney, Agent, or Firm* — Ladas & Parry LLP

(57) ABSTRACT

A double-surface manufacturing method and an exposure apparatus in the manufacturing process of semiconductors and liquid crystal displays (LCD) are provided. In the exposure process, two masks in the exposure apparatus are subjected to alignment treatment; the substrate is conveyed to a position between the two masks in the exposure apparatus; and patterns of the two surfaces of the substrate are processed. The exposure apparatus comprises two masks, wherein a substrate to be processed is disposed between the two masks; and mask alignment marks are respectively disposed on the two masks. The embodiments of the present invention improve the accuracy of the patterns of the two surfaces of the substrate and the product quality in the double surfaces manufacturing of the substrate.

9 Claims, 4 Drawing Sheets

(56) References Cited

FOREIGN PATENT DOCUMENTS

| JP | H04291911 A | | 10/1992 |
|---|---|---|---|
| JP | 2000155430 A | | 6/2000 |
| JP | 2004347964 | * | 12/2004 |

OTHER PUBLICATIONS

English translation of Second Office Action issued by the Chinese Patent Office for Chinese Patent Application No. 201210477747.7 dated Sep. 4, 2014, 6pgs.
English language abstract of JP2000155430 A, listed above, 2 pages.
English language abstract of JPH04291911 A, listed above, 2 pages.
English language abstract of JPH03273608 A, listed above, 2 pages.
English language abstract of JPS6172216 A, listed above, 2 pages.
German language abstract of DE2352035 A1, listed above, 1 page.
Extended European Search Report (in English) issued by the European Patent Office ("EPO") on Jan. 4, 2014 for application No. 13193732.8, 10 pages.
First Office Action (Chinese language) issued by the State Intellectual Property Office ("SIPO") on Feb. 25, 2014 re application No. 2012104777477, 5 pages.
English translation of First Office Action issued by SIPO on Feb. 25, 2014, listed above, 5 pages.
Office Action Rejection Decision (Chinese language) issued by the State Intellectual Property Office ("SIPO") on Jan. 19, 2015 for International Application No. 201210477747.7, 7 pages.
English translation of Office Action Rejection Decision (listed above), issued by SIPO on Jan. 19, 2015 for International Application No. 201210477747.7, 10 pages.

* cited by examiner

US 9,141,000 B2

DOUBLE-SURFACE MANUFACTURING METHOD AND EXPOSURE APPARATUS

CROSS REFERENCE TO RELATED APPLICATIONS

This application claims priority from Chinese National Application No. 201210477747.7 filed on Nov. 21, 2012, the contents of which are incorporated herein by reference.

TECHNICAL FIELD

Embodiments of the present invention relate to a double-surface manufacturing method and an exposure apparatus in the manufacturing process of semiconductors and liquid crystal displays (LCD).

BACKGROUND

In the current manufacturing field of display technology products such as touch screens and gratings, the double-surface manufacturing technology, that is, the double-surface processing technology, is increasingly used. Moreover, with the development of technology, there is a need for higher quality product to meet the people's requirement, and hence higher requirement is put forward in the area of accurate control for the patterning process.

In the conventional double-surface patterning process technology, for the touch screen products with low accuracy requirement, it is tended to adopt the process without alignment for the double surfaces. Although such kind of manufacturing process is simple, the accuracy is too low to impact the back-end display. As for grating products with higher accuracy requirement, a pattern of one surface is manufactured at first, and then a pattern of another surface and the manufactured surface are subjected to alignment recognition to achieve position alignment. Although such a way can achieve accurate alignment, it is difficult to implement the alignment process and the product yield is low.

SUMMARY

According to one aspect of the present invention, a double-surface manufacturing method in the exposure process is provided. The double-surface manufacturing method comprises:

S1: performing alignment treatment on two masks in an exposure apparatus;

S2: conveying a substrate to a position between the two masks of the exposure apparatus; and S3: performing exposure operation for patterns of two surfaces on the substrate.

In the step S1, the performing alignment treatment on two masks is performed according to mask alignment marks respectively disposed on the two masks.

In the step S3, when either surfaces of the substrate is subjected to exposure operation, the substrate is subjected to alignment operation in advance by the substrate alignment marks disposed on two sides of the substrate and on the masks.

According to another aspect of the present invention, a double-surface manufacturing exposure apparatus is also provided. The double-surface manufacturing exposure apparatus comprises two masks, wherein a substrate to be manufactured is disposed between the two masks; and mask alignment marks are respectively disposed on the two masks.

In an example, the exposure apparatus comprises two light sources which are respectively and correspondingly disposed on two sides of the substrate; and emergent light of each light source performs exposure operation on the substrate through the mask.

In an example, the exposure apparatus comprises a single light source; emergent light of the single light source has a bidirectional light path of two unidirectional light paths; wherein the two unidirectional light paths are respectively disposed on the two sides of the substrate; and each of the unidirectional light paths performs exposure operation on the substrate through the mask.

Each of the unidirectional light paths in the exposure apparatus is controlled independently.

In an example, the mask alignment marks are in Cross-shaped.

In an example, the substrate alignment marks disposed on two sides of the substrate and on the masks are in X-shaped.

BRIEF DESCRIPTION OF THE DRAWINGS

The embodiments of the present invention will be described in a detailed way in connection with the accompanying drawings such that those skilled in the art can understand the invention more clearly, in which.

In the accompanying drawings, the components represented by various numerals are as follows:
1-mask, 2-mask alignment mark, 3-substrate, 4-substrate alignment mark, 5-exposure light source, 6-first mirror, 7-second mirror, 8-lens.

DETAILED DESCRIPTION

In order to make the purposes, technical solutions and advantages of embodiments of the present invention more clear, technical solutions according to the embodiments of the present invention will be described clearly and completely below in conjunction with the accompanying drawings of embodiments of the present invention. It is to be understood that the described embodiments are part of but not all of exemplary embodiments of the present invention. Based on the described exemplary embodiments of the present invention, all other embodiments obtained by those of ordinary skill in the art without creative labor shall fall into the protection scope of the present invention.

Unless otherwise defined, all the technical and scientific terms used herein have the same meanings as commonly understood by one of ordinary skill in the art to which the present invention belongs. The terms "first," "second," and the like, which are used in the description and the claims of the present application, are not intended to indicate any sequence, amount or importance, but for distinguishing various components. Also, the terms, such as "a/an," "one," "the" and the like, are not intended to limit the amount, but for indicating the existence of at lease one. The terms "comprise/comprising," "include/including," and the like, are intended to specify that the elements or the objects stated before these terms encompass the elements or the objects and equivalents thereof listed after these terms, but not preclude other elements or objects. The phrases "connect", "connected" and the like, are not intended to define a physical connection or mechanical connection, but may include an electrical connection/coupling, directly or indirectly. "On," "under," and the like are only used to indicate relative position relationship, and when the position of the object which is described is changed, the relative position relationship may be changed accordingly.

In the conventional double-surface manufacturing method, it is difficult to recognize the substrate alignment marks and the product yield is low. The embodiments of the present invention provide a double-surface manufacturing exposure apparatus, wherein the alignment treatment is performed on masks at first and then patterns of two surfaces of the substrate are processed or made, respectively.

Figure 1:
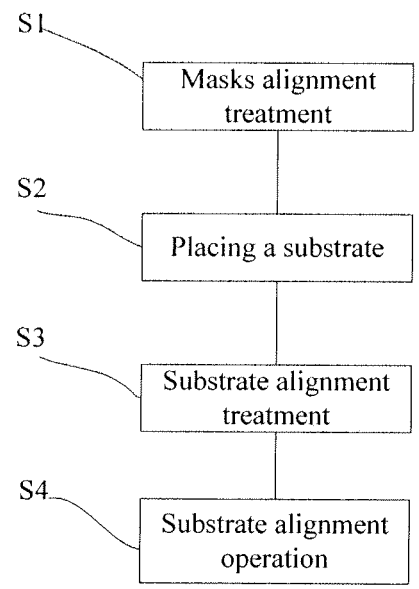
FIG. 1 is a double-surface manufacturing flowchart of an embodiment of the present invention.
Figure 2:
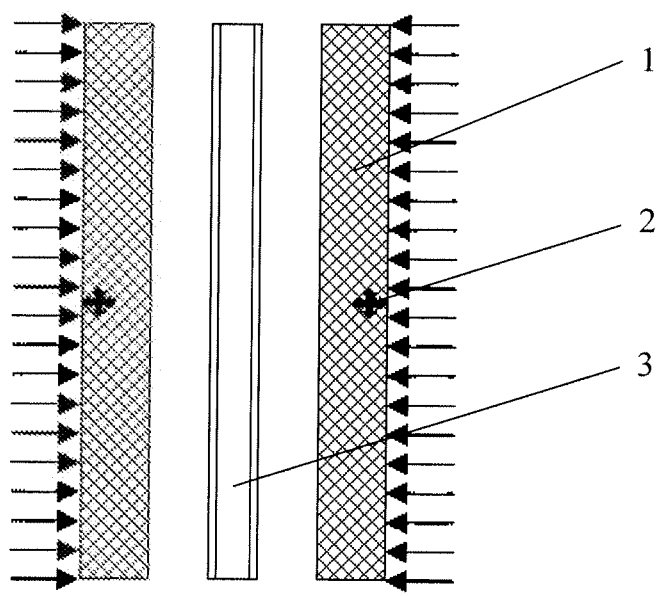
FIG. 2 illustrates a schematic structural view of an exposure apparatus in an embodiment of the present invention.

Embodiments of the present invention provide a double-surface manufacturing method and an exposure apparatus in the manufacturing process of semiconductors and LCDs. In the exposure operation process, as illustrated in FIGS. 1 and 2, the double-surface pattern processing method comprises:

S1: performing alignment treatment on two masks 1 for double-surface manufacturing.

Figure 6:
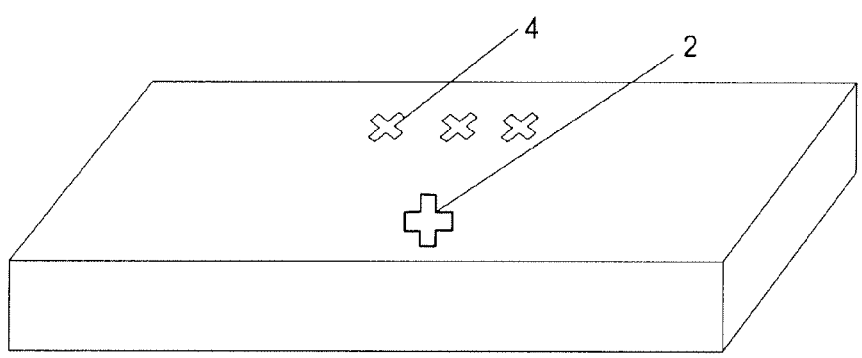
FIG. 6 is a schematic diagram of mask alignment marks in an embodiment of the present invention.

The alignment treatment on the masks 1 may be performed by manual adjustment or position measurement. For example, mask alignment marks 2 are respectively disposed on the two masks 1, which may be in any shape, such as Cross-shaped mask alignment marks 2, as illustrated in FIG. 6. The two masks 1 may be subjected to alignment treatment by a conventional alignment device, such as Charge-coupled Device (CCD), according to the set mask alignment marks 2, so that the position adjustment can be performed.

The exposure direction in an exposure unit area may be vertical or horizontal. The exposure apparatus may use two exposure light sources. In addition, the exposure apparatus can also use a single exposure light source on the conventional structure of an exposure unit, which will be further described below.

S2: conveying a substrate 3 to a position between the two masks 1 of the exposure apparatus. Two surfaces of the substrate 3, to be performed double-surface processing, may be coated with a BM photoresist.

S3: patterning the two surfaces of the substrate 3.

Figure 3:
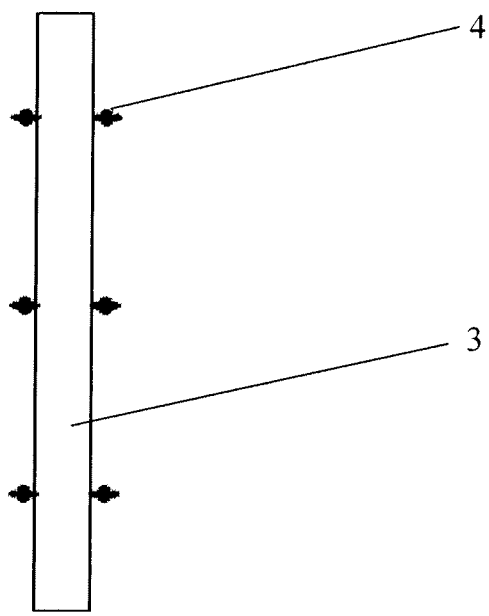
FIG. 3 illustrates a schematic structural view of a substrate and marks thereof in an embodiment of the present invention.
Figure 5:
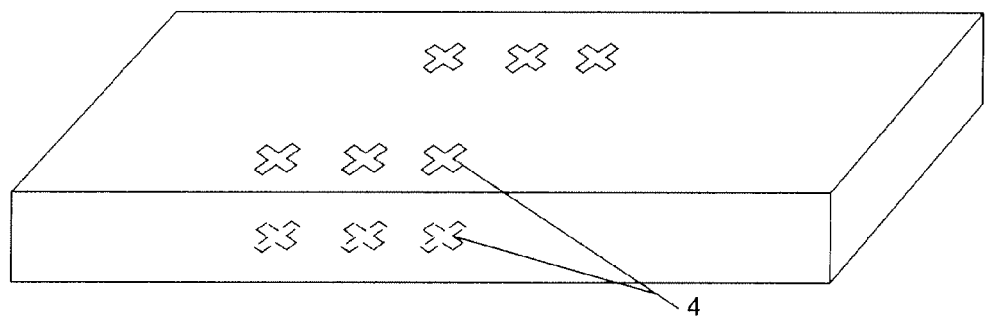
FIG. 5 is a schematic diagram of substrate alignment marks in an embodiment of the present invention.

In the step, firstly, substrate alignment marks 4 are made on the two surfaces of the substrate 3. As illustrated in FIGS. 3 and 5, for example, the substrate alignment marks 4 are respectively and correspondingly disposed on the upper surface and the lower surface of the substrate 3. The substrate alignment marks may be in X-shaped or in any other shape or pattern. Meanwhile, as illustrated in FIG. 6, substrate alignment marks 4, which are same as for the substrate 3, are also correspondingly disposed on a surface of the mask 1.

Then, the substrate alignment marks 4 are subjected to alignment operation after being made. The patterns of the two surfaces of the substrate 3 are made by conventional method, for example, forming a film to be patterned on each of the two surfaces of the substrate, applying a photoresist layer over the film, exposing, developing, etching, and striping the photoresist. Such patterning process can be done in normal sequence. The alignment operation of the substrate 3 can be performed by aligning the substrate alignment marks 4 disposed on the surfaces of the substrate and the substrate alignment marks 4 correspondingly disposed on the masks 1. In the manufacturing process, both the patterns of the two surfaces of the substrate 3 are subjected to alignment operation of the substrate alignment marks 4, so that the accuracy of the double-surface manufacturing of the substrate 3 can be guaranteed and the performance requirements for the grating products or high-accuracy touch screen products can be met.

Figure 4:
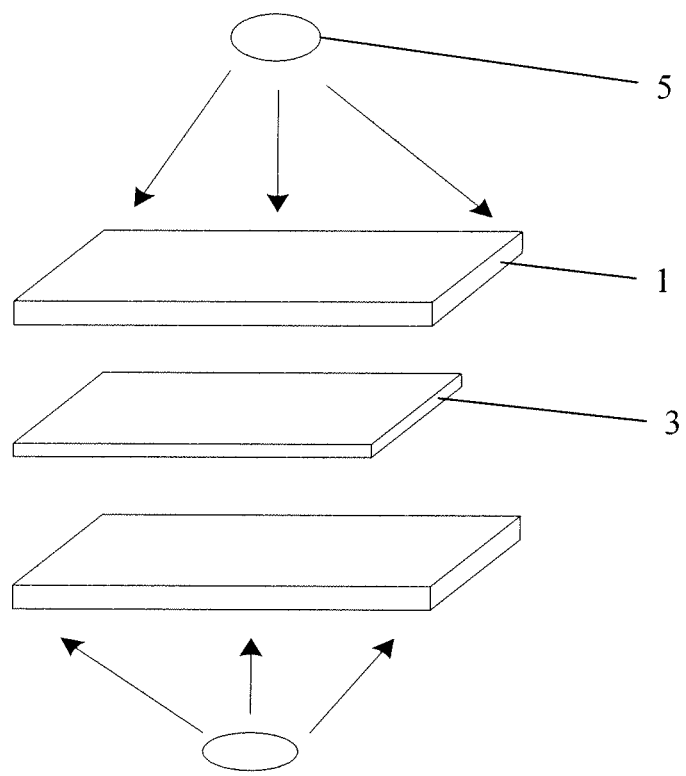
FIG. 4 illustrates a schematic structural view of an exposure apparatus horizontally arranged using bidirectional light sources, in an embodiment of the present invention.

As illustrated in FIG. 4, the double-surface manufacturing exposure apparatus comprises two masks 1, wherein a substrate 3 to be processed is disposed between the two masks 1; and mask alignment marks 2 are respectively disposed on the two masks 1 so as to perform alignment treatment to the masks 1. The mask alignment marks 2 may be in any pattern or shape, such as Cross-shaped or any other shape. Substrate alignment marks 4 are disposed on two side surfaces of the substrate 3 and on the masks 1, and configured to perform alignment operation before performing the exposure treatment to the substrate. In the embodiment, the substrate alignment marks 4 may be in X-shaped.

Figure 7A:
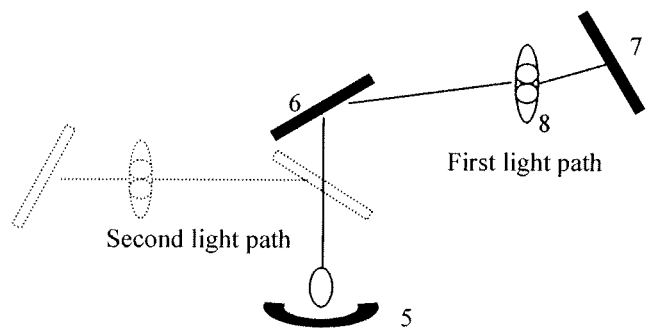
FIG. 7A is a schematic diagram of one example of an embodiment of the present invention, wherein bidirectional light paths are formed by a single light source.
Figure 7B:
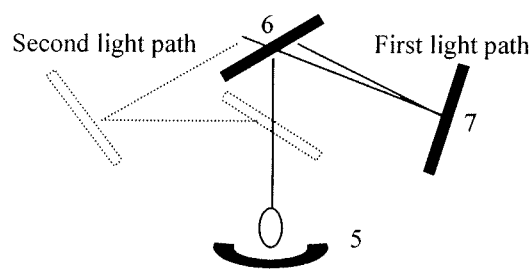
FIG. 7B is a schematic diagram of another example of the embodiment of the present invention, wherein bidirectional light paths are formed by a single light source.

The exposure apparatus may use two light sources. In this case, two exposure light sources 5 are respectively disposed on two sides of the substrate to be double-surface processed and respectively disposed on the outside of corresponding masks 1. Each unidirectional light path performs exposure operation on the substrate 3 through the mask 1. The exposure apparatus may also use a single exposure light source. In this case, a light path of the original light source may be modified, so that the original light source is converted into bidirectional light paths (horizontal or vertical) through light path modification. The two unidirectional light paths are respectively positioned on two sides of the substrate 3, and each unidirectional light path performs exposure operation to the substrate 3 through the mask 1. The modification method for converting the single light source may be through light path adjustment means, such as mirror reflection and/or lens refraction and the like. For example, in the two examples as illustrated in FIGS. 7A and 7B, light emitted by a single light source 5 is directed to a first mirror 6, a second mirror 7, a lens 8 or the like to form two light paths, namely, a first light path and a second light path. The direction of the formed light paths, namely the first light path and the second light path, may be changed according to different arrangements of the first mirror 6, the second mirror 7 or the corresponding lens 8, and hence the exposure light paths can be controlled. In the bidirectional light paths of one single exposure light source, the unidirectional light paths from one single light source can be controlled independently. Each of the unidirectional light paths being controlled independently is helpful in adjusting the exposure light paths, so that the exposure quality of products can be improved.

According to the embodiments of the present invention, in the manufacturing process of the masks, the accuracy of mask patterns can be about 1.0 μm. If a conventional exposure apparatus is used, the recognition accuracy of the mask alignment marks and the alignment accuracy of an alignment system can be about 1.0-2.0 μm, thus, the accuracy of the finally formed substrate alignment marks can be controlled to be within 3.0 μm. For the double-surface manufacturing process is not subjected to the alignment operation in prior art, and the alignment accuracy can be controlled to be within 30 μm. Therefore, compared with the prior art, the embodiments of the present invention can greatly improve the alignment accuracy of double-surface manufacturing or pattern processing.

In the manufacturing process of the patterns of the two surfaces of the substrate, the embodiment(s) of the present invention perform(s) alignment operation on the masks in advance, so that the accuracy of the patterns of the two surfaces of the substrate is guaranteed and the product quality is improved.

The embodiment(s) of the present invention further use(s) the alignment marks on the two surfaces of the substrates for alignment operation, so that the accuracy of the positions of the patterns of the two surfaces of the substrate is guaranteed and the product quality is improved.

The embodiment(s) of the present invention use(s) the way of simultaneously exposing the two surfaces, and hence improve(s) the efficiency of the exposure process and guarantee(s) the accurate positioning in the double-surface manufacture.

Above described are only the exemplary embodiments of the present invention and not intended to limit the scope of the present invention. Other embodiments, modifications and variations can be easily contemplated by an ordinary skill in the art without departing from the spirit and the principle of the present invention, and shall fall within the scope of protection of the present invention.

The invention claimed is:

1. A double-surface manufacturing method in the exposure process, comprising:
   S1: performing alignment treatment on two masks by using mask alignment marks respectively disposed on the two masks in an exposure apparatus;
   S2: conveying a substrate to a position between the two masks of the exposure apparatus; and
   S3: performing exposure operation for patterns of two surfaces of the substrate after the substrate was subjected to alignment with the two masks by using substrate alignment marks disposed on the two opposite surfaces of the substrate and on the two masks.

2. A double-surface manufacturing exposure apparatus, comprising
   two masks with mask alignment marks respectively disposed thereon, wherein a substrate to be processed is disposed between the two masks and substrate alignment marks are disposed on two opposite surfaces of the substrate and on the two masks;
   and
   a single light source; emergent light of the single light source has a bidirectional light path of two unidirectional light paths; the two unidirectional light paths are respectively disposed on the two sides of the substrate; and each of the unidirectional light paths performs exposure operation to the substrate through each of the two masks.

3. The double-surface manufacturing exposure apparatus according to claim 2, wherein each of the unidirectional light paths in the exposure apparatus is controlled independently.

4. The double-surface manufacturing exposure apparatus according to claim 2, wherein the mask alignment marks are in Cross-shaped.

5. The double-surface manufacturing exposure apparatus according to claim 4, wherein the substrate alignment marks are in X-shaped.

6. A double-surface manufacturing exposure apparatus, comprising:
   two masks with mask alignment marks respectively disposed thereon;
   wherein a substrate to be processed is disposed between the two masks, and substrate alignment marks are disposed on two opposite surfaces of the substrate and on the two masks.

7. The double-surface manufacturing exposure apparatus according to claim 6, further comprising two light sources which are respectively and correspondingly disposed on the two sides of the substrate; and emergent light of each of the light sources performs exposure operation to the substrate through each of the two masks.

8. The double-surface manufacturing exposure apparatus according to claim 6, wherein the mask alignment marks are in Cross-shaped.

9. The double-surface manufacturing exposure apparatus according to claim 6, wherein the substrate alignment marks are in X-shaped.

* * * * *